United States Patent
Dao et al.

(10) Patent No.: US 8,518,764 B2
(45) Date of Patent: Aug. 27, 2013

(54) SEMICONDUCTOR STRUCTURE HAVING A THROUGH SUBSTRATE VIA (TSV) AND METHOD FOR FORMING

(75) Inventors: Thuy B. Dao, Austin, TX (US); Joel E. Keys, Austin, TX (US); Hernan A. Rueda, Chandler, AZ (US); Paul W. Sanders, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/279,776

(22) Filed: Oct. 24, 2011

(65) Prior Publication Data

US 2013/0099312 A1 Apr. 25, 2013

(51) Int. Cl.
  *H01L 21/336* (2006.01)
  *H01L 29/66* (2006.01)
(52) U.S. Cl.
  USPC ........................................... 438/197; 257/335
(58) Field of Classification Search
  USPC .................... 257/335; 438/141, 142, 197
  See application file for complete search history.

(56) References Cited

U.S. PATENT DOCUMENTS

| 7,633,165 | B2 | 12/2009 | Hsu et al. |
| 7,884,016 | B2 | 2/2011 | Sprey et al. |
| 2004/0178430 | A1 | 9/2004 | Rhodes et al. |
| 2004/0251481 | A1 | 12/2004 | Rhodes |
| 2010/0133611 | A1 * | 6/2010 | Disney et al. .................. 257/335 |

OTHER PUBLICATIONS

Agarwal et al.; "Polysilicon Interconnections (FEOL): Fabrication and Characterization"; 11th Electronics Packaging Technology Conference; 2009; pp. 317-320; IEEE.
Kang et al.; "A Stress Relief Method for Copper Filled Through Silicon Via with Parylene on Sidewall"; 11th International Conference on Electronic Packaging Technology & High Density Packaging; 2010; pp. 98-101; IEEE.

* cited by examiner

*Primary Examiner* — Calvin Lee
*Assistant Examiner* — Monica D Harrison
(74) *Attorney, Agent, or Firm* — Joanna G. Chiu; James L. Clingan, Jr.

(57) ABSTRACT

A semiconductor device structure includes a substrate having a background doping of a first concentration and of a first conductivity type. A through substrate via (TSV) is through the substrate. A device has a first doped region of a second conductivity on a first side of the substrate. A second doped region is around the TSV. The second doped region has a doping of a second concentration greater than the first concentration and is of the first conductivity type.

14 Claims, 7 Drawing Sheets

US 8,518,764 B2

SEMICONDUCTOR STRUCTURE HAVING A THROUGH SUBSTRATE VIA (TSV) AND METHOD FOR FORMING

BACKGROUND

1. Field

This disclosure relates generally to semiconductor processing, and more specifically, to a semiconductor structure having a through substrate via (TSV) and method for forming.

2. Related Art

In current semiconductor technologies, a through substrate via (TSV) can be used to provide a connection path from a top side of an integrated circuit substrate to a back side of the integrated circuit substrate. This allows for back side connections to the integrated circuit. For example, TSVs may be used to make back side connections to ground.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment of the present invention, a TSV is used to provide a path from a device on a top side of a substrate to a back side of the substrate, such as for a back side ground connection. This device may be an LDMOS device for a high voltage application, such as for an RF or power amplifier application. LDMOS devices can be used for such high voltage applications due their high break down voltages. In one embodiment, a TSV is used to provide a back side ground connection to the source of an LDMOS device. In one embodiment, a high voltage of greater than or equal to 20 volts is applied to the drain of the LDMOS device. However, with a high voltage applied to the drain of the device and the source connected to ground, a large drain leakage current may be observed. This drain leakage current is dependent upon the applied drain voltage and the proximity of the drain region of the LDMOS device to the TSV, as well as the impurity concentration. In high density designs, the spacing between the LDMOS device and the TSV required to reduce this drain leakage is too great. Therefore, in one embodiment, a heavily doped region is formed along the sidewalls of the TSV in order to alter the physics of the metal-semiconductor contact interface between the TSV and substrate, which results in reduced drain leakage current and precludes early reverse bias drain-source junction breakdown. In this manner, current TSV spacing requirements need not be altered.

Furthermore, other types of devices (in addition to LDMOS devices) may use these TSVs for back side connections (such as back side ground connections). For example, the heavily doped region formed along the sidewalls of the TSV allows for the creation of a large depletion region similar to the intrinsic region ("I" region) of a PIN diode. This PIN structure can be utilized to form a low-loss substrate for various types of devices, such as high frequency passive devices, if a suitable cathode design is utilized (in which the cathode design includes a doped region of opposite conductivity type to the conductivity type of the heavily doped region along sidewalls of the TSV).

Figure 1:
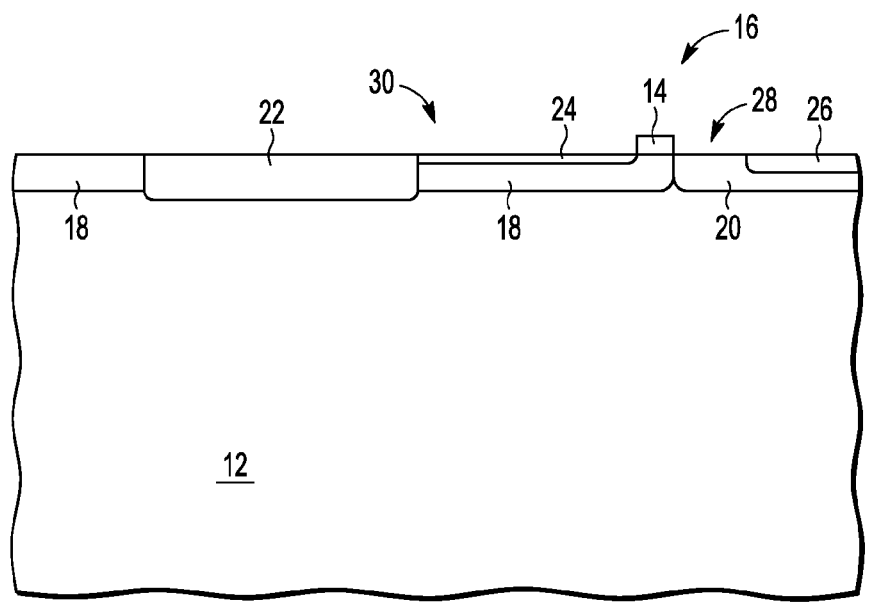
FIG. 1 illustrates, in cross-sectional form, a semiconductor structure at an initial stage in processing, in accordance with one embodiment of the present disclosure.

FIG. 1 illustrates a cross section view of a semiconductor structure 10 having a substrate 12 and an LDMOS device 16 formed in and on a top surface of substrate 12. Note that LDMOS device 16 may also be referred to as an LDMOS transistor. LDMOS device 16 includes a gate 14 formed on a top surface of substrate 12, in which gate 14 has a first sidewall and a second sidewall, opposite the first sidewall. LDMOS device 16 includes a doped region 18 in the top surface of substrate 12 which laterally extends from the second sidewall of gate 14 under gate 14 and continues to extend laterally in a first direction from first sidewall of gate 14. LDMOS device 16 also includes a doped region 20 in the top surface of substrate 12 which extends laterally in a second direction from the second sidewall of gate 14. LDMOS device 16 also includes a doped region 24 in the top surface of substrate 12 which extends laterally in the first direction from the first sidewall of gate 14 (and not extending under gate 14), and a doped region 22 in the top surface of substrate 12 and laterally adjacent doped region 24. Doped regions 22 and 24 are located in doped region 18, in which doped region 18 extends deeper into substrate 12 as compared to doped region 24 and doped region 22 extends deeper into substrate 12 as compared to doped region 18. LDMOS device 16 also includes a doped region 26 in doped region 20 in the top surface of substrate 12. Doped region 20 extends deeper into substrate 12 as compared to doped region 26. Doped region 26 is laterally spaced apart from the second sidewall of gate 14. In one embodiment, it is located at a distance in a range of 1 to 6 microns from gate 14. This lateral distance from gate 14 is one of the factors which determines the breakdown voltage for LDMOS device 16. A source region 30 of LDMOS device 16 includes doped regions 18 and 24 and is aligned to one side of gate 14, and a drain region 28 of LDMOS device 16 includes doped regions 20 and 26. Doped region 22 may be referred to as a body connection of LDMOS device 16.

In one embodiment, substrate 12 is silicon. Substrate 12 has a background doping of a first concentration and of a first conductivity type. In one embodiment, substrate 12 is very lightly doped with a P type dopant, thus having a background doping of P- -. In one embodiment, LDMOS device 16 is an N-type device formed in a P-type substrate. In this embodiment, doped regions 24 and 26 may have a conductivity of N+, doped region 18 may have a conductivity of P, and doped region 22 may have a conductivity of P+. Doped region 20 may be referred to as the lightly doped drain extension or the drift region. Doped region 18 may be referred to as the laterally diffused P-well or a PHV region. Also, in one embodiment, substrate 12 may have a conductivity of N- - instead of P- -. Since substrate 12 is very lightly doped, substrate 12 has a high resistivity.

Figure 2:
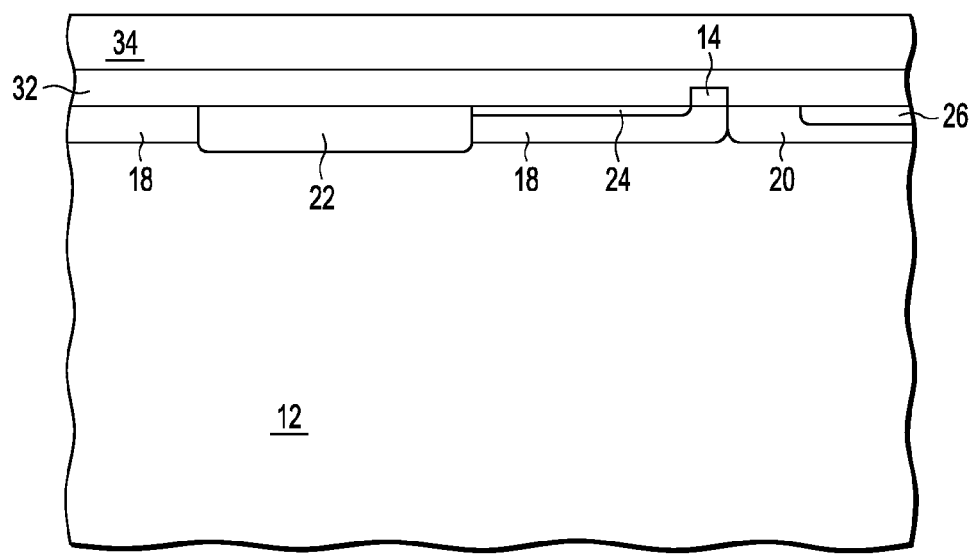
FIG. 2 illustrates, in cross-sectional form, the semiconductor structure of FIG. 1 at a subsequent stage in processing, in accordance with one embodiment of the present disclosure.

FIG. 2 illustrates a cross section view of semiconductor structure 10 of FIG. 1 after formation of an interlayer dielectric layer (ILD) 32 and a masking layer 34. In one embodiment, ILD layer 32 is a dielectric layer which is blanket deposited over the top surface of substrate 12 and is subsequently planarized, such as by a chemical mechanical polish (CMP). Masking layer 34 may be a hard mask layer, such as a nitride layer, and may be blanket deposited over ILD layer 32.

Figure 3:
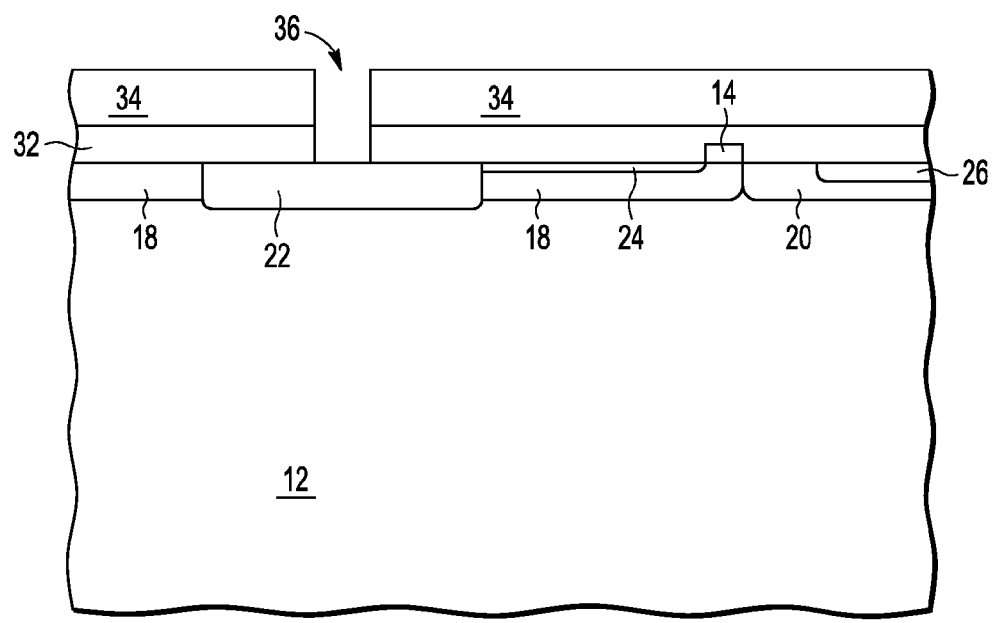
FIG. 3 illustrates, in cross-sectional form, the semiconductor structure of FIG. 2 at a subsequent stage in processing, in accordance with one embodiment of the present disclosure.

FIG. 3 illustrates a cross section view of semiconductor structure 10 of FIG. 2 after formation of an opening 36 through masking layer 34 and ILD layer 32. In one embodiment, a patterned masking layer is formed over masking layer 34, such as a patterned photoresist layer, and an etch is performed using the patterned masking layer to form opening 36. The patterned masking layer may then be removed.

Figure 4:
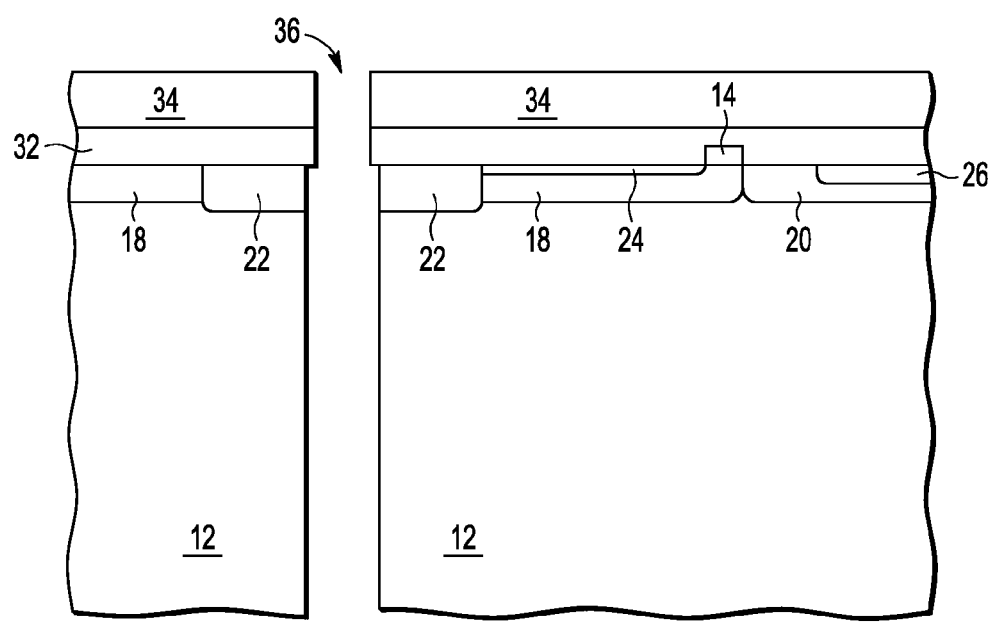
FIG. 4 illustrates, in cross-sectional form, the semiconductor structure of FIG. 3 at a subsequent stage in processing, in accordance with one embodiment of the present disclosure.

FIG. 4 illustrates a cross section view of semiconductor structure 10 of FIG. 3 in which opening 36 is extended into substrate 12. In one embodiment, an etch is performed using opening 36 in masking layer 34 as a mask to extend opening 36 through a majority of substrate 12. For example, in one embodiment, opening 36 extends at least 70 microns into substrate 12. Note that opening 36 does not yet extend all the way through to a back side of substrate 12. Also, opening 36 is the opening which will be used to form a TSV.

Figure 5:
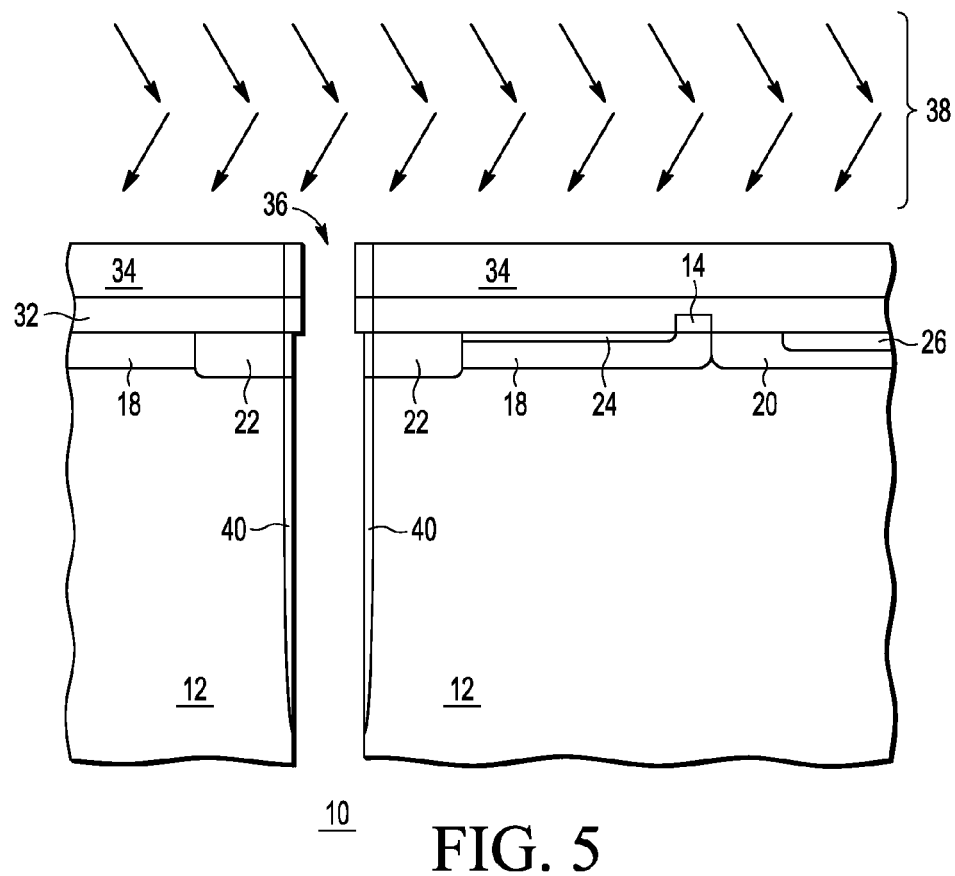
FIG. 5 illustrates, in cross-sectional form, the semiconductor structure of FIG. 4 at a subsequent stage in processing, in accordance with one embodiment of the present disclosure.

FIG. 5 illustrates a cross section view of semiconductor structure 10 of FIG. 4 in which an angled implant 38 is performed to result in a doped region 40 along sidewalls of opening 36. Implant region 40 may be referred to as a TSV depletion barrier region. In the illustrated embodiment, angled implant 38 may include a series of angled implants to introduce dopants into the sidewalls of opening 36. The depth into opening 36 and the thickness along the sidewalls of opening 36 of doped region 40 depend on the parameters of the implant, such as the dopant type, the dopant dosage, and the dopant energy. In one embodiment, doped region 40 extends at least 20 microns into substrate 12 as measured from the top surface of substrate 12. In one embodiment, doped region 40 has a thickness in range of 0.1 to 0.2 microns along the sidewalls of opening 36 and tapers as it extends deeper into opening 36. Doped region 40 is a heavily doped P-type region (e.g. a P+ region) having a dopant concentration that is greater than the background dopant concentration of substrate 12. For example, the dopant concentration of doped region 40 may exceed the dopant concentration of substrate 12 by more than one hundred times or more than ten thousand times. In one embodiment, such as when substrate 12 is P- -, doped region 40 may have a doping of P+. For example, a P-type dopant is used, such as boron. In this example, a dosage of 1e15 at an energy of 80 keV may be used with an implant angle of 7 degrees from vertical to form implant region 40. Note that the presence of P+ doped region 40 may also allow for substrate 12 to be very lightly doped with an N type dopant (e.g. N- -).

In one embodiment, the angled implant is broken into separate steps with a portion of the total implant introduced in each step. Between each step, the wafer is rotated to direct the implant into each side of opening 36. In this embodiment, the wafer is implanted with a quarter ($\frac{1}{4}^{th}$) of the total dose at a wafer rotation of zero degrees. The wafer is then rotated by 90 degrees and implanted with another quarter of the total dose. The wafer is then rotated an additional 90 degrees and implanted with another quarter of the total dose. The wafer is then rotated an additional 90 degrees and implanted with the final quarter dose of the total dose.

Figure 6:
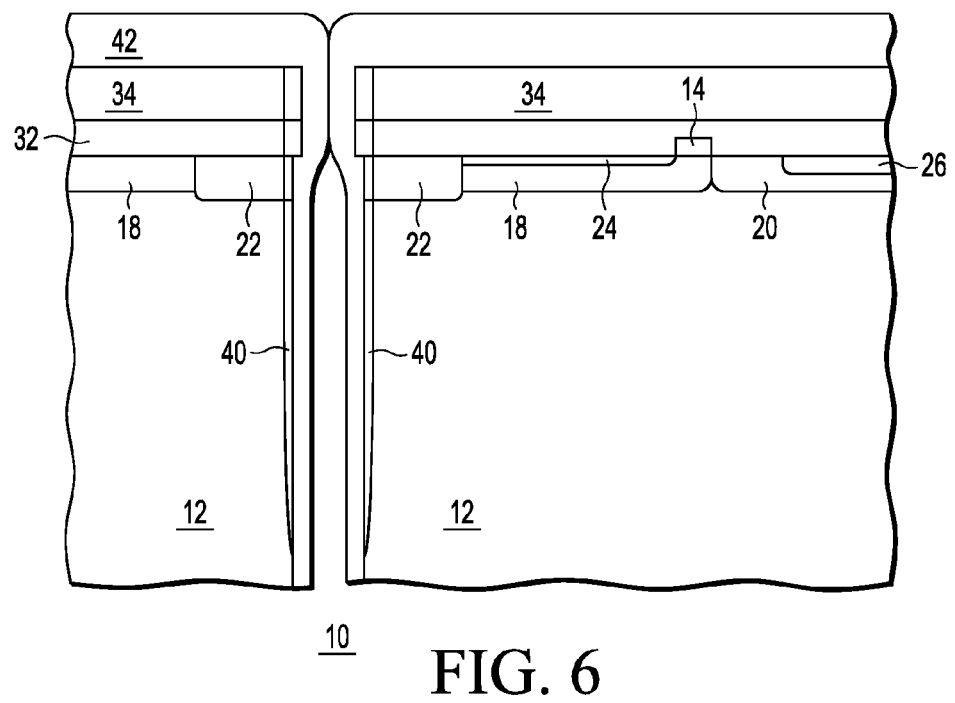
FIG. 6 illustrates, in cross-sectional form, the semiconductor structure of FIG. 5 at a subsequent stage in processing, in accordance with one embodiment of the present disclosure.

FIG. 6 illustrates a cross section view of semiconductor structure 10 of FIG. 5 after formation of a metal layer 42 over masking layer 34 and within opening 36. In one embodiment, metal layer 42 is blanket deposited, and, due to the overhang of masking layer 34 and ILD layer 32 over opening 36 in substrate 12, results in closing off opening 36. In one embodiment, metal layer 42 includes a titanium layer, a titanium nitride layer over the titanium layer, and a tungsten layer over the titanium nitride layer. In this manner, the titanium layer is formed adjacent doped region 40 along sidewalls of opening 36, then the titanium nitride layer is formed adjacent the titanium layer, and then the tungsten layer is formed adjacent the titanium nitride layer. Alternatively, other stacks of materials may be used in which other metals may be used.

Figure 7:
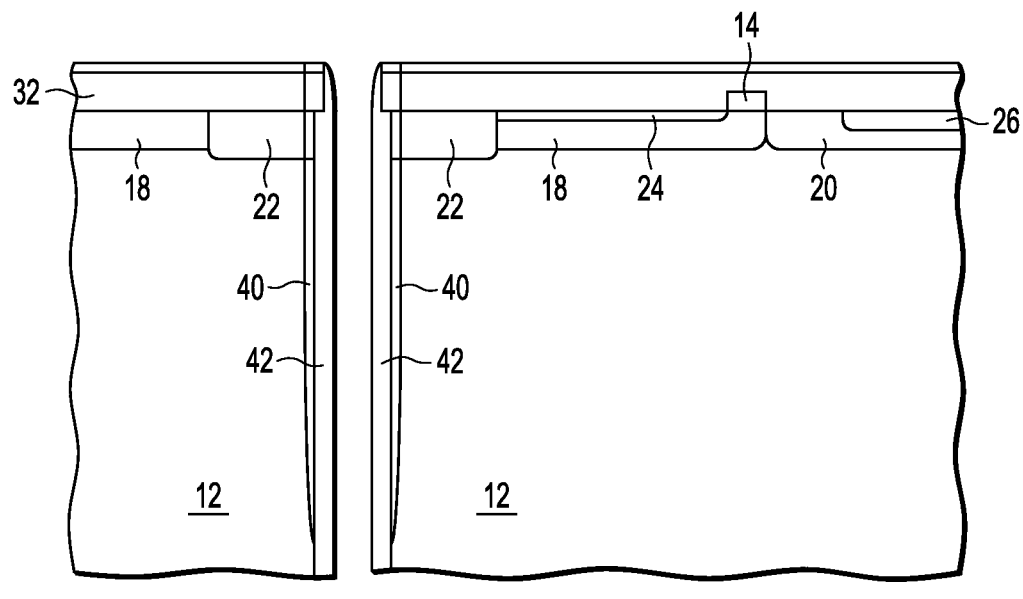
FIG. 7 illustrates, in cross-sectional form, the semiconductor structure of FIG. 6 at a subsequent stage in processing, in accordance with one embodiment of the present disclosure.

FIG. 7 illustrates a cross section view of semiconductor structure 10 of FIG. 6 after a metal etch back is performed. The metal etch back removes most of masking layer 34 and re-opens opening 36 which was previously closed off by metal layer 42.

Figure 8:
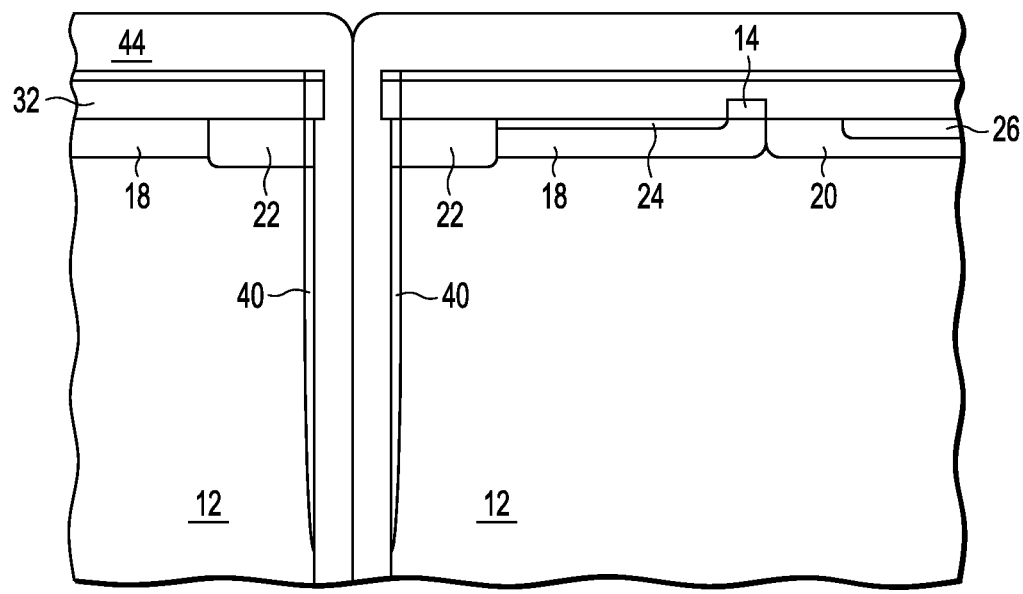
FIG. 8 illustrates, in cross-sectional form, the semiconductor structure of FIG. 7 at a subsequent stage in processing, in accordance with one embodiment of the present disclosure.

FIG. 8 illustrates a cross section view of semiconductor structure 10 of FIG. 7 after formation of a metal layer 44 over remaining portions of masking layer 34 and within opening 36, adjacent metal layer 42. In one embodiment, metal layer 44 is blanket deposited and is the same as metal layer 42. For example, metal layer 44 may also be a stack of titanium, titanium nitride, and tungsten. Therefore, within opening 36, metal layer 42 and metal layer 44 form a combined metal fill which may include a single seam between the metal layers along opposing sidewalls of opening 36.

Figure 9:
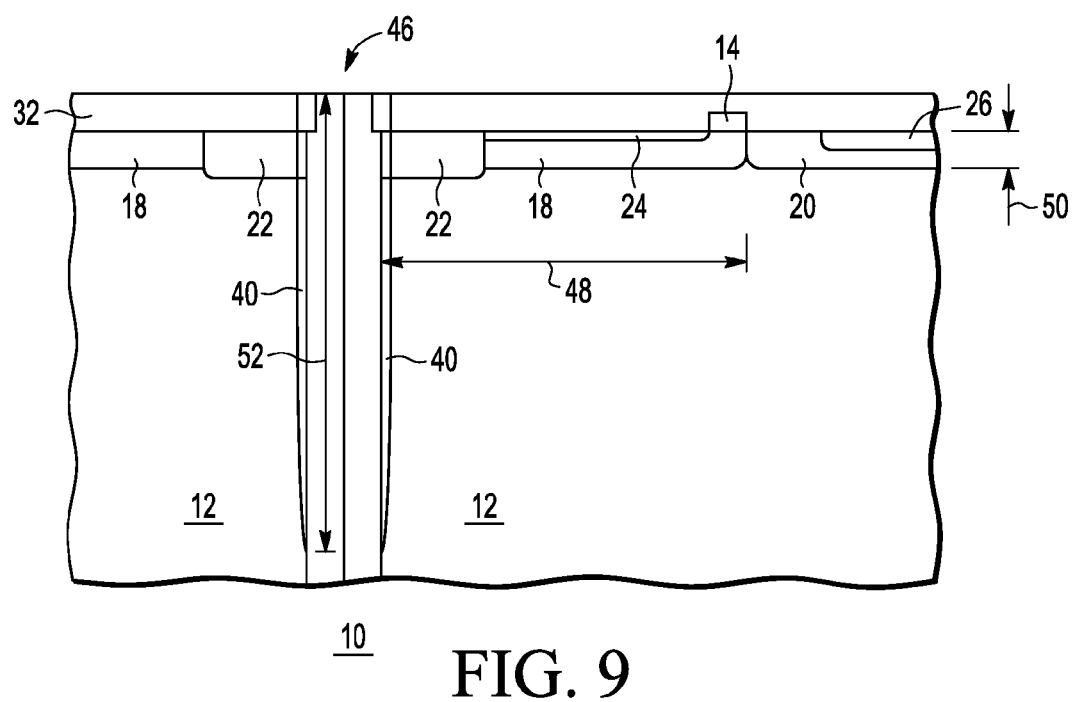
FIG. 9 illustrates, in cross-sectional form, the semiconductor structure of FIG. 8 at a subsequent stage in processing, in accordance with one embodiment of the present disclosure.

FIG. 9 illustrates a cross section view of semiconductor 10 of FIG. 8 after a metal etch back is performed. Therefore, after the metal etch back, the metal in opening 36 is planarized, resulting in the initial formation of TSV 46, in which doped region 40 directly contacts TSV 46 (directly contacting the metal of TSV 46). Note that formation of TSV is not completed until subsequent processing is performed. For example, any number of interconnect layers may be formed over ILD 32 and a final passivation layer may be formed over the interconnect layers. After formation of the final passivation layer, processing may continue on the back side of substrate 12. For example, a back side grind is performed to expose TSV 46 at the back side of substrate 12. Afterwards, further processing may be performed on the back side of substrate 12 to complete semiconductor structure 10. For example, TSV 46 allows for source 30 to be coupled to ground at the back side of substrate 12.

As illustrated in FIG. 9, doped region 40 surrounds TSV 46 and extends sufficiently deep into substrate 12 to prevent drain leakage current introduced by the application of high voltages to drain 28. For example, depth 50, which represents how far the drain region (or the drift region) extends into substrate 12 from the top surface of substrate 12 may be in the range of 0.5-2 microns, while a depth 52, which represents how far doped region 40 extends into substrate 12 along sidewalls of TSV 46 from the top surface of substrate 12 may be 10 microns or more, 20 microns or more, or 25 microns or more, or 30 microns or more. In one embodiment, depth 52 is not less than ten times greater than depth 50. In one embodiment, depth 52 is between 10 and 30 microns. In one embodiment, depth 52 is greater than depth 50 by at least a factor of 5.

In one embodiment, doped region 40, which results in a heavily doped region between the metal of TSV 46 and highly resistive substrate 12, forms a buffer region which supplies charge carriers as the depletion region spreads from the drain region upon application of a high voltage to the drain region. Therefore, with the presence of heavily doped region 40, the ohmic contact of TSV 46 is protected against punch-through from the drain depletion region and the drain leakage current is reduced as compared to the drain leakage current without doped region 40. Due to the changed behavior of TSV 46 with the presence of doped region 40, the drain leakage is not as dependent upon distance 48 between TSV 46 and drift region 20. Therefore, current spacing requirements between TSVs and devices need not be altered.

Figure 10:
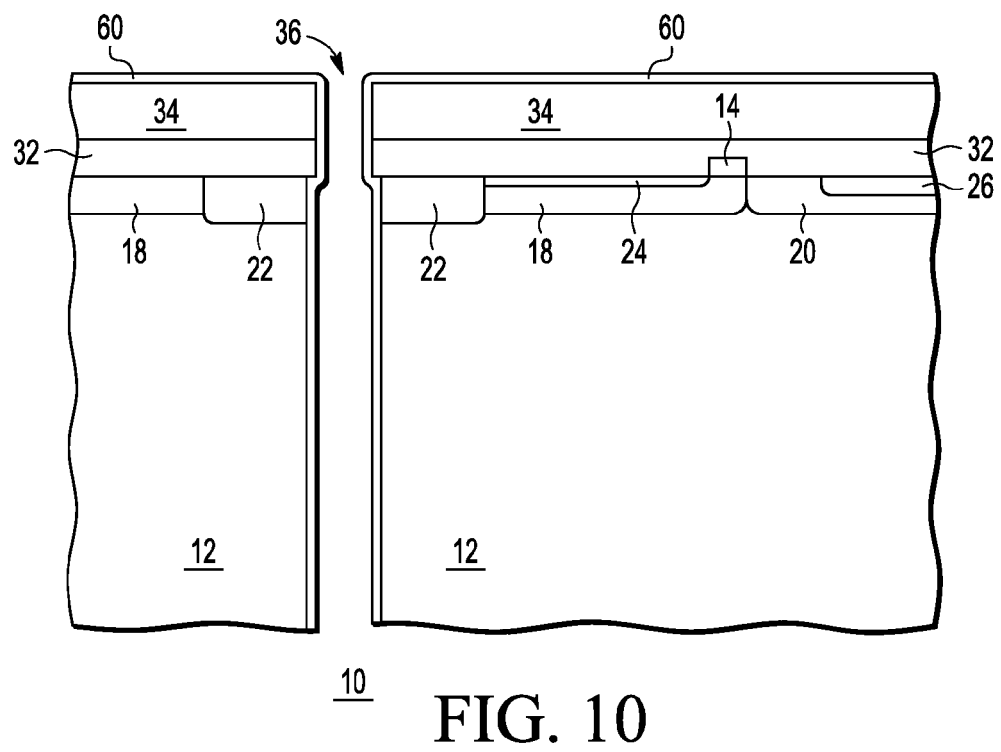
FIG. 10 illustrates, in cross-sectional form, the semiconductor structure of FIG. 4 at a subsequent stage in processing, in accordance with one embodiment of the present disclosure.

FIG. 10 illustrates a cross section view of semiconductor structure 10 of FIG. 4 in accordance with an alternate embodiment in which an in-situ doped polysilicon layer 60 is formed over patterned masking layer 34 and within opening 36. In one embodiment, polysilicon layer 60 is blanket deposited over substrate 12 such that it forms along sidewalls of opening 36. Polysilicon layer 60 forms a heavily doped region along sidewalls of opening 36 similar to doped region 40 described which also forms a heavily doped region along sidewalls of opening 36. Therefore, polysilicon layer 60 within opening 36 may be referred to as doped region 60. Doped region 60 is a heavily doped region which may have a doping of the same conductivity type as the doping of substrate 12, but with a dopant concentration that is greater than the dopant concentration of substrate 12. For example, the dopant concentration of doped region 60 may exceed the dopant concentration of substrate 12 by more than one hundred times or more than ten thousand times. In one embodiment, doped region 60 may have been formed with an in situ doping of conductivity type of P+. For example, a P-type dopant may be used, such as boron. In the case of in-situ doped polysilicon, the dopant is not implanted but introduced during the polysilicon deposition. The doping level can be 1e15 to 1e20. Also, in this embodiment, substrate 12 may alternatively be N- -.

Figure 11:
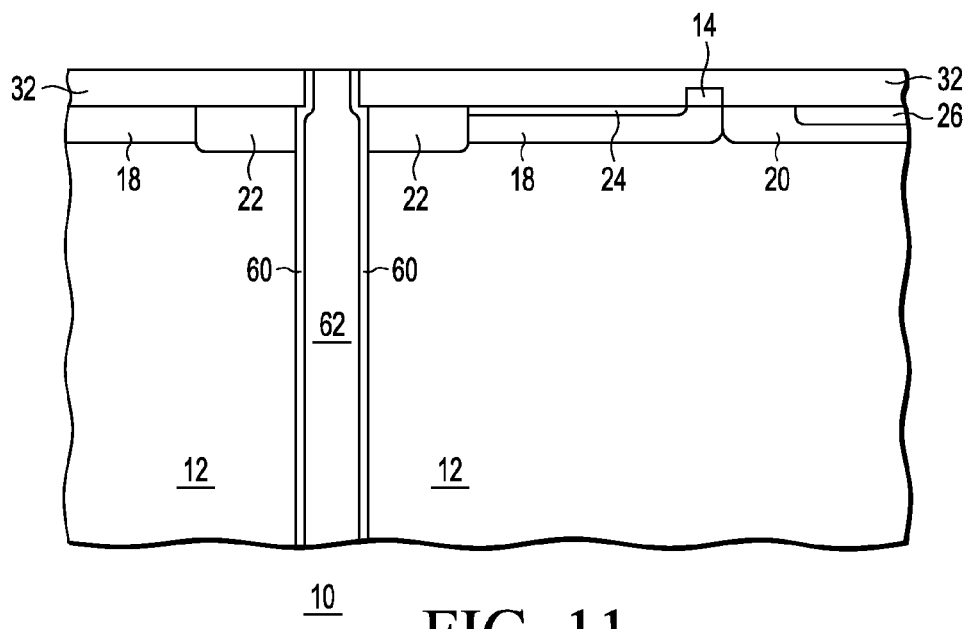
FIG. 11 illustrates, in cross-sectional form, the semiconductor structure of FIG. 10 at a subsequent stage in processing, in accordance with one embodiment of the present disclosure.

FIG. 11 illustrates a cross section view of semiconductor structure 10 of FIG. 10 after filling opening 36 with a metal to form a TSV 62. Note that the same process used to form TSV 46 (such as the steps described in FIGS. 6-9 above) can be repeated here to form TSV 62. Also, note that the effects provided by doped region 40 are also provided by doped region 60 along TSV 62 (which surrounds TSV 62 and is in direct contact with the metal of TSV 62). That is, the presence of heavily doped region 60, TSV 62 illustrates the behavior of a protected ohmic contact and the drain leakage current is reduced. Also, the current spacing requirements between TSVs and devices need not be altered.

After the processing stage illustrated in FIG. 11, processing may continue to form any number of interconnect layers over ILD 32 and a final passivation layer may be formed over the interconnect layers. After formation of the final passivation layer, processing may continue on the back side of substrate 12. For example, a back side grind is performed to expose TSV 62 at the back side of substrate 12. Afterwards, further processing may be performed on the back side of substrate 12 to complete semiconductor structure 10. For example, TSV 62 allows for source 30 to be coupled to ground at the back side of substrate 12. Also, note that, unlike doped region 40, doped region 62 extends the full length of TSV 62. Therefore, doped region 62 extends deeper into substrate 12 as compared to doped region 40.

Referring to either FIG. 9 or 11, note that the TSV with a surrounding heavily doped region (such as P+ doped region 40 or 60) creates an anode of a PIN structure, in which N-type drift region 20 creates the cathode of the PIN structure, and substrate 12 between the cathode and anode corresponds to the "I" region. Therefore, under reverse bias, substrate 12 between the anode and cathode will be swept free of carriers (and thus be substantially depleted) so that a region of very low conductivity is established and allows for minimum interactions with adjacent devices. In this manner, the drain leakage current of the LDMOS device of FIGS. 1-11 is reduced.

Figure 12:
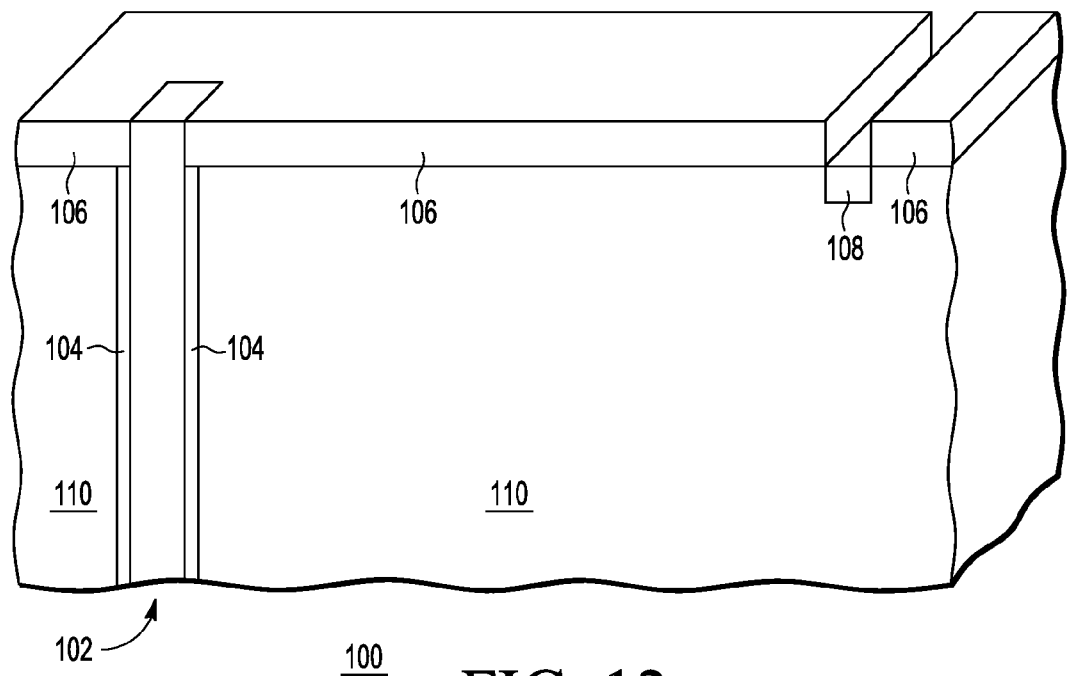
FIG. 12 illustrates, in 3-dimensional form, a PIN structure, in accordance with one embodiment of the present disclosure.

FIG. 12 illustrates, in 3-dimensional form, a PIN structure 100 which includes a substrate 110, a TSV 102 formed in a top surface of substrate 110, extending deep into substrate 110. Structure 100 includes a doped region 104 which completely surrounds TSV 102 and is in contact with TSV 102. Note that TSV 102 and doped region 104 may be formed in the same way as was described above with respect to TSV 46 and doped region 40 or TSV 62 and doped region 60. Structure 100 also includes a doped region 108 formed in the top surface of substrate 110 that is laterally spaced apart from TSV 102 and doped region 104. Doped region 108 may be formed using known patterning and doping techniques. Structure 100 also includes a dielectric layer 106 over substrate 110. In one embodiment, substrate 110 has a background doping of a first conductivity type and first concentration (such as P- -), doped region 104 has a doping of the first conductivity type but with a greater concentration than substrate 110 (such as P+), and doped region 108 has a doping of a second conductivity type, opposite the first conductivity type (such as N+). For example, in one embodiment, the concentration of doped region 04 exceeds the concentration of substrate 110 by more than one hundred times, or by more than ten thousand times. Doped region 104 which surrounds TSV 102 forms an anode of the PIN structure, doped region 108 forms a cathode of the PIN structure, and the substrate region between the cathode and anode corresponds to the intrinsic region of the PIN. As described above, under reverse bias, substrate 110 between the anode and cathode will be fully depleted, and thus behaves as a dielectric. This fully depleted region may therefore be used as an enhanced substrate to form low-loss, high frequency devices.

For example, in one embodiment, doped region 108 may correspond to doped region 20 or 26 of LDMOS device 16 of FIGS. 1-11 described above. Therefore, the dimensions and dimension comparisons provided above between doped region 40 and drift region 20 also apply to doped region 104 and doped region 108, respectively. For example, doped region 108 may extend 0.5-2 microns into substrate 110 from the top surface of substrate 110 doped region 104 may extend 10 microns or more into substrate 110 along sidewalls of TSV 192 from the top surface of substrate 110. Alternatively, doped region 104 may extend 20 microns or more, 25 microns or more, or 30 microns or more into substrate 110. In one embodiment, doped region 104 extends ten times greater or more into substrate 110 than doped region 108. In alternate embodiments, other types of devices having an N-type doped region may be formed which use TSV 102 for a ground connection such that the N-type doped region may create a cathode for a PIN structure to result in a fully depleted substrate.

Figure 13:
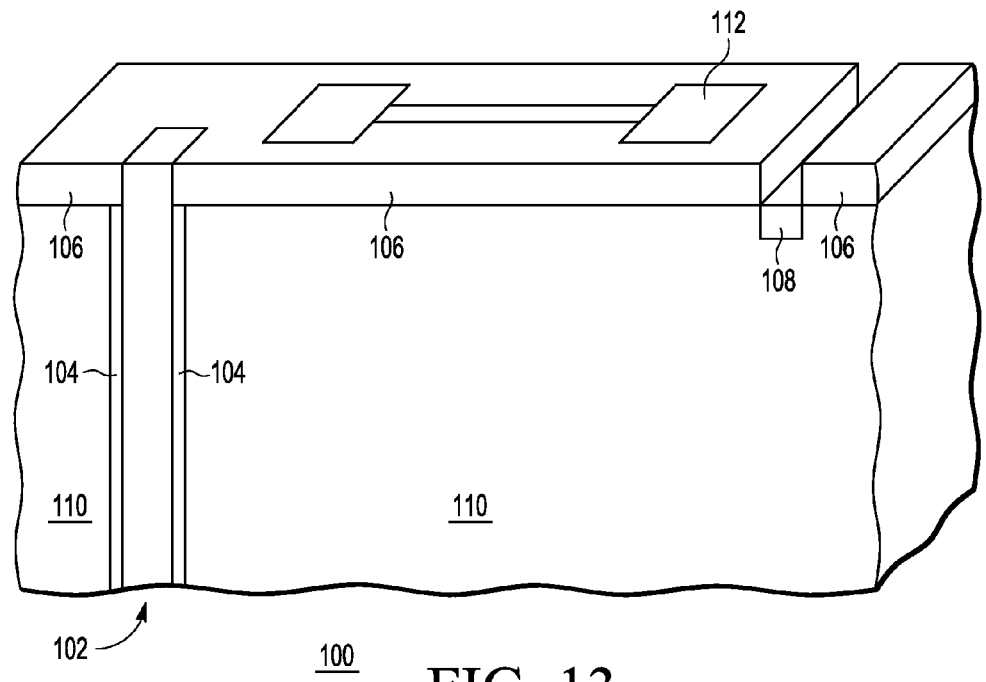
FIG. 13 illustrates, in 3-dimensional form, a PIN structure with a transmission line, in accordance with one embodiment of the present disclosure.
Figure 14:
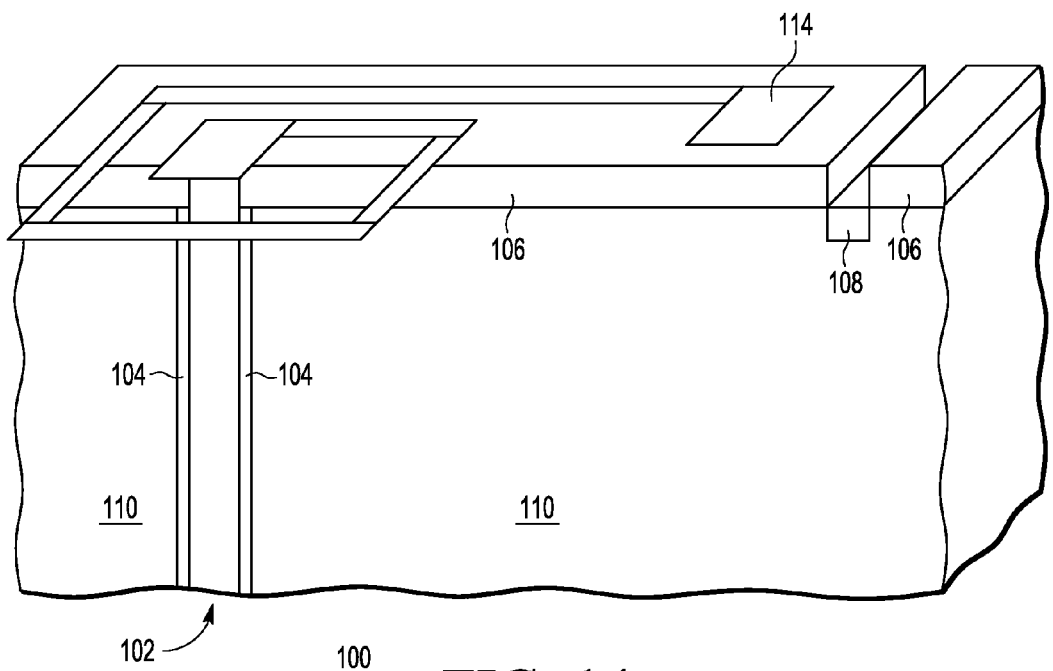
FIG. 14 illustrates, in 3-dimensional form, a PIN structure with an inductor coil, in accordance with one embodiment of the present disclosure.

In one embodiment, doped region 108 may be formed to surround or encircle TSV 102 in which devices may be formed in substrate 110 between doped regions 104 and 108 (in the fully depleted region of the PIN structure). In one embodiment, doped region 108 forms a ring around TSV 102. FIGS. 13 and 14 illustrate PIN structure 100 of FIG. 12 in which a reactive passive device is formed over the fully depleted region of the PIN structure. In the examples of FIGS. 13 and 14, doped region 108 encircles TSV $102^{nd}$ the reactive passive device. Note that like numerals are used to indicate like elements.

FIG. 13 illustrates PIN structure 100 in which a transmission line 112 is formed on and within the fully depleted region of substrate 110, between doped regions 104 and 108. FIG. 14 illustrates PIN structure 100 in which an inductor 114 is on and within the fully depleted region of substrate 100. In FIG. 14, a first terminal of inductor 114 is connected to TSV 102 in order to connect to ground. Also, in FIG. 14, doped region 108 forms a ring around TSV 102 in which TSV 102 may be at the center of the ring.

Therefore, by now it should be appreciated that there has been provided an improved TSV having a heavily doped region between the metal of the TSV and the semiconductor substrate. A doped region of opposite conductivity type may, together with the heavily doped region surrounding the TSV, form a PIN structure. The doped region of opposite conductive type may correspond, for example, to a drift region of an LDMOS device or to a ring around the TSV in which devices may be formed. In this manner, a fully depleted region may be formed in the substrate when reverse biased, thus allowing for improved operation, such as in high voltage and high frequency applications.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the TSVs may be formed to provide back side connections for any type of device or transistor. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a semiconductor device structure including a substrate having a background doping of a first concentration and of a first conductivity type, and including a through substrate via (TSV) through the substrate; a device on a first side of the substrate, wherein the device has a first doped region of a second conductivity type; a second doped region around the TSV, wherein the second doped region has a doping of a second concentration greater than the first concentration and is of the first conductivity type. Item 2 includes the semiconductor device structure of item 1, wherein the device is a laterally diffused MOS (LDMOS) transistor coupled to the TSV. Item 3 includes the semiconductor device structure of item 2, wherein the LDMOS transistor has a body connection of the first conductivity type coupled to the TSV. Item 4 includes the semiconductor device structure of item 3, wherein the second doped region extends to a depth in the substrate below a depth of the body connection. Item 5 includes the semiconductor device structure of item 3, wherein the first doped region is source of the LDMOS transistor adjacent to the body connection. Item 6 includes the semiconductor device structure of item 5, wherein the LDMOS transistor has a gate and the source is aligned to one side of the gate. Item 7 includes the semiconductor device structure of item 1, wherein the second doped region directly contacts the TSV. Item 8 includes the semiconductor device structure of item 1, wherein the first doped region includes a drift region of the LDMOS transistor extending to a first depth below the first side of the substrate, the second doped region extends to a second depth below the first side of the substrate, the second depth is greater than the first depth. Item 9 includes the semiconductor device structure of item 8, wherein the second depth is not less than ten times greater than the first depth. Item 10 includes the semiconductor device structure of item 1, wherein the first doped region encircles the TSV. Item 11 includes the semiconductor device structure of item 1, wherein the second concentration exceeds the first concentration by more than one hundred times. Item 12 includes the semiconductor device structure of item 11, wherein the second concentration exceeds the first concentration by more than ten thousand times. Item 13 includes the semiconductor device structure of item 12, wherein the LDMOS transistor has a drift region extending to a first depth below the first side of the substrate, the doped region extends to a second depth below the first side of the substrate, and the second depth is greater than the first depth by at least a factor of 5.

Item 14 includes a semiconductor device structure including a semiconductor substrate having a via through the semiconductor substrate from a first side to a second side; a device on a first side having a first doped region; a second doped region around and in contact with the via; and wherein: the substrate has a background doping level of a first concentration; the substrate has a first conductivity type; the first doped region is of the second conductivity type and has a first depth below the substrate; the second doped region has a second depth below the substrate; the second depth is greater than the first depth; the second doped region has a doping level of a second concentration; and the second concentration is greater than the first concentration. Item 15 includes the semiconductor device structure of item 14, wherein the first doped region includes a drift region of an LDMOS device. Item 16 includes the semiconductor device structure of item 14, wherein the first doped region encircles the second doped region.

Item 17 includes a method of forming a semiconductor device structure using a semiconductor substrate having a background doping of a first concentration and of a first conductivity type, including forming a device in and on a first side of the semiconductor substrate having a first doped region of a second conductivity type, wherein the second doped region has a first depth below the first side; forming an opening through the substrate extending between the first side and a second side of the substrate; forming a second doped region, wherein the second doped region is in the opening extending to a second depth from the first side greater than the first depth, has a second concentration greater than the first concentration, and is of the first conductivity type; and filling the opening with metal, wherein the metal is in contact with the second doped region. Item 18 includes the method of item 17, wherein the forming the second doped region includes depositing in-situ doped polysilicon in the opening. Item 19 includes the method of item 17, wherein the forming the second doped region includes performing an implant to apply dopant to a sidewall of the opening to the second depth. Item 20 includes the method of item 17, wherein the forming a device includes forming one of a group consisting of a laterally diffused MOS (LDMOS) transistor having a drift region as the first doped region and a ring on the first side around the opening, wherein the ring is the first doped region.

What is claimed is:

1. A method of forming a semiconductor device structure using a semiconductor substrate having a background doping of a first concentration and of a first conductivity type, comprising:
    forming a device in and on a first side of the semiconductor substrate having a first doped region of a second conductivity type, wherein the second doped region has a first depth below the first side;
    forming an opening through the substrate extending between the first side and a second side of the substrate;
    forming a second doped region, wherein the second doped region is in the opening extending to a second depth from the first side greater than the first depth, has a second concentration greater than the first concentration, and is of the first conductivity type; and
    filling the opening with metal, wherein the metal is in contact with the second doped region.

2. The method of claim 1, wherein the forming the second doped region comprises depositing in-situ doped polysilicon in the opening.

3. The method of claim 1, wherein the forming the second doped region comprises performing an implant to apply dopant to a sidewall of the opening to the second depth.

4. The method of claim 3, wherein the forming a device comprises forming one of a group consisting of a laterally diffused MOS (LDMOS) transistor having a drift region as the first doped region and a ring on the first side around the opening, wherein the ring is the first doped region.

5. A semiconductor device structure including a substrate having a background doping of a first concentration and of a first conductivity type, comprising:
    a through substrate via (TSV) through the substrate;
    a device on a first side of the substrate, wherein the device has a first doped region of a second conductivity type;
    a second doped region around the TSV, wherein the second doped region has a doping of a second concentration greater than the first concentration and is of the first conductivity type,
    wherein the device is a laterally diffused MOS (LDMOS) transistor coupled to the TSV, wherein the LDMOS transistor has a body connection of the first conductivity type coupled to the TSV, and wherein the second doped region extends to a depth in the substrate below a depth of the body connection.

6. The semiconductor device structure of claim 5, wherein the first doped region is source of the LDMOS transistor adjacent to the body connection.

7. The semiconductor device structure of claim 6, wherein the LDMOS transistor has a gate and the source is aligned to one side of the gate.

8. The semiconductor device structure of claim 5 wherein the second doped region directly contacts the TSV.

9. The semiconductor device structure of claim 5, wherein the first doped region encircles the TSV.

10. A semiconductor device structure including a substrate having a background doping of a first concentration and of a first conductivity type, comprising:
    a through substrate via (TSV) through the substrate;
    a device on a first side of the substrate, wherein the device has a first doped region of a second conductivity type;
    a second doped region around the TSV, wherein the second doped region has a doping of a second concentration greater than the first concentration and is of the first conductivity type,
    wherein the first doped region comprises a drift region of the LDMOS transistor extending to a first depth below the first side of the substrate, the second doped region extends to a second depth below the first side of the substrate, the second depth is greater than the first depth, and wherein the second depth is not less than ten times greater than the first depth.

11. A semiconductor device structure including a substrate having a background doping of a first concentration and of a first conductivity type, comprising:
    a through substrate via (TSV) through the substrate;
    a device on a first side of the substrate, wherein the device has a first doped region of a second conductivity type;
    a second doped region around the TSV, wherein the second doped region has a doping of a second concentration greater than the first concentration and is of the first conductivity type, wherein the second concentration exceeds the first concentration by more than ten thousand times, and wherein the LDMOS transistor has a drift region extending to a first depth below the first side of the substrate, the doped region extends to a second depth below the first side of the substrate, and the second depth is greater than the first depth by at least a factor of 5.

12. A semiconductor device structure, comprising:
    a semiconductor substrate having a via through the semiconductor substrate from a first side to a second side;
    a device on a first side having a first doped region;
    a second doped region around and in contact with the via; and
    wherein:

the substrate has a background doping level of a first concentration;
the substrate has a first conductivity type;
the first doped region is of the second conductivity type and has a first depth below the substrate;
the second doped region has a second depth below the substrate;
the second depth is greater than the first depth;
the second doped region has a doping level of a second concentration; and
the second concentration is greater than the first concentration.

13. The semiconductor device structure of claim 12, wherein the first doped region comprises a drift region of an LDMOS device.

14. The semiconductor device structure of claim 12, wherein the first doped region encircles the second doped region.

* * * * *